(12) United States Patent  (10) Patent No.: US 8,451,610 B2
Kharazmi  (45) Date of Patent: May 28, 2013

(54) ELECTRICAL CIRCUIT COMPONENT CARRIER

(75) Inventor: Saeid Kharazmi, Norrköping (SE)

(73) Assignee: SAPA Profiler AB, Finspang (SE)

( * ) Notice: Subject to any disclaimer, the term of this patent is extended or adjusted under 35 U.S.C. 154(b) by 208 days.

(21) Appl. No.: 13/119,311

(22) PCT Filed: Sep. 8, 2009

(86) PCT No.: PCT/EP2009/061648
§ 371 (c)(1),
(2), (4) Date: May 5, 2011

(87) PCT Pub. No.: WO2010/031715
PCT Pub. Date: Mar. 25, 2010

(65) Prior Publication Data
US 2011/0205707 A1    Aug. 25, 2011

(30) Foreign Application Priority Data

Sep. 16, 2008 (SE) ...................................... 0801978

(51) Int. Cl.
*H05K 7/20* (2006.01)
(52) U.S. Cl.
USPC ...... 361/699; 361/679.53; 361/698; 361/707; 361/709; 361/711; 165/80.4; 165/104.33; 165/185; 62/259.2
(58) Field of Classification Search
USPC ............... 361/679.46, 679.53, 688, 689, 698, 361/699, 700–712, 715–724; 165/80.2–80.5, 165/133, 148, 165, 167, 247, 299, 300, 168; 165/143, 170, 104.33, 185; 257/706–727; 62/3.2, 233, 238.6, 113, 419, 22, 259.25; 29/890.03; 174/15.1, 16.3, 252
See application file for complete search history.

(56) References Cited

U.S. PATENT DOCUMENTS 4,938,280 A * 7/1990 Clark ........................... 165/80.4
5,002,123 A   3/1991 Nelson et al.
(Continued)

FOREIGN PATENT DOCUMENTS

DE      10203238 A1   6/2003
DE   202007001266 U1   6/2007
(Continued)

OTHER PUBLICATIONS

PCT/ISA/210—International Search Report—Jan. 21, 2010.
(Continued)

*Primary Examiner* — Michail V Datskovskiy
(74) *Attorney, Agent, or Firm* — Loeb & Loeb, LLP

(57) ABSTRACT

An extruded aluminum electrical circuit component carrier on which at least one electrical circuit component is to be mounted. A first side portion and a second side portion include areas for mounting at least one first electrical circuit component part and at least one second electrical circuit component part. An inlet to which an inlet conduit for a cooling liquid can be connected. An outlet to which an outlet conduit for the cooling liquid can be connected. At least one supply passage for the cooling liquid formed through the first side portion. At least one return passage for the cooling liquid formed through the second side portion. The at least one supply passage is connected to the at least one return passage in series. An area of a cross-section of the at least one return passage is smaller than an area of a cross-section of the at least one supply passage, whereby in use a flow velocity of the at least one return passage exceeds a flow velocity of the at least one supply passage so that an essentially uniform cooling capacity for the first and second electrical circuit component parts is achieved.

18 Claims, 3 Drawing Sheets

U.S. PATENT DOCUMENTS

| | | | |
|---|---|---|---|
| 6,186,660 B1* | 2/2001 | Kopf-Sill et al. | 366/340 |
| 6,253,835 B1* | 7/2001 | Chu et al. | 165/80.4 |
| 6,337,794 B1* | 1/2002 | Agonafer et al. | 361/690 |
| 6,354,002 B1* | 3/2002 | Wright et al. | 29/890.03 |
| 6,517,234 B1* | 2/2003 | Kopf-Sill et al. | 366/340 |
| 6,822,865 B2 | 11/2004 | Balszunat et al. | |
| 6,983,792 B2* | 1/2006 | Dickey et al. | 165/170 |
| 7,059,390 B2* | 6/2006 | Laurila et al. | 165/80.4 |
| 7,104,312 B2* | 9/2006 | Goodson et al. | 165/80.4 |
| 7,139,172 B2* | 11/2006 | Bezama et al. | 361/699 |
| 7,156,159 B2* | 1/2007 | Lovette et al. | 165/104.33 |
| 7,203,064 B2* | 4/2007 | Mongia et al. | 361/701 |
| 7,259,965 B2* | 8/2007 | Chang et al. | 361/699 |
| 7,508,669 B2* | 3/2009 | Fonfara et al. | 361/699 |
| 8,157,001 B2* | 4/2012 | Hom et al. | 165/299 |
| 2004/0099946 A1 | 5/2004 | Dickey et al. | |
| 2004/0238162 A1* | 12/2004 | Seiler et al. | 165/148 |
| 2005/0274506 A1 | 12/2005 | Bhatti et al. | |
| 2006/0226539 A1* | 10/2006 | Chang et al. | 257/712 |
| 2009/0145642 A1* | 6/2009 | Kuromitsu et al. | 174/258 |
| 2009/0213541 A1* | 8/2009 | Butterbaugh et al. | 361/689 |

FOREIGN PATENT DOCUMENTS

| | | |
|---|---|---|
| EP | 0269065 A2 | 6/1988 |
| EP | 1605741 A1 | 12/2005 |
| JP | 2002009477 A | 1/2002 |
| WO | WO-95/17765 A2 | 6/1995 |
| WO | WO-2006/100690 A2 | 9/2006 |

OTHER PUBLICATIONS

PCT/ISA/237—International Preliminary Report on Patentability/Written Opinion of the International Searching Authority—Jan. 21, 2010.

* cited by examiner

ELECTRICAL CIRCUIT COMPONENT CARRIER

CROSS-REFERENCE TO RELATED APPLICATIONS

This application claims priority under 35 U.S.C. §119 to Swedish patent application 0801978-8 filed 16 Sep. 2008 and is the national phase under 35 U.S.C. §371 of PCT/EP2009/061648 filed 8 Sep. 2009.

TECHNICAL FIELD

The present invention relates to an electrical circuit component carrier, and to the use of such a carrier.

BACKGROUND ART

Electronic components are continuously improved, their sizes reduced and their capacity increased. The ever increasing power density entails that also the cooling of electronic components needs to be improved.

EP1605741 A1 relates to a cooling element of an electronic device. In the flow channel of the cooling element, a pressure difference is provided between the forward and tail end. This way, it is possible to branch off from the flow channel a secondary cycle between an inlet opening and outlet opening that are in different pressure areas.

WO9517765 A2 discloses a heat sink used in cooling electronic components. The heat sink includes channels which are formed in opposite sides of the heat sink.

U.S. Pat. No. 5,002,123 A1 relates to fluid heat exchanger for cooling an electronic component having a housing for receiving heat from the electronic component. The housing has a fluid inlet and an outlet at opposite ends of the housing. The cross-sectional area of the housing for conveying fluid from the inlet to the outlet decreases from the inlet to the outlet thereby reducing pressure drop without sacrificing thermal performance.

U.S. Pat. No. 6,822,865 B2 describes a cooling device for semiconductor modules, where the diameters of flow channels may be adjusted for distribution purposes. This device suffers from the disadvantage that an optimised and uniform cooling is not obtained. Especially when semiconductor components are cooled by a coolant flowing through channels connected in series, the most downstream component will be subject to higher working temperatures. A 10° C. increase in working temperature typically shortens the component working life by 50%.

Thus, there is a need for improved cooling of electronic components. Principally a highly uniform cooling is desired, by means of which the temperature of two or more components, or two or more component parts, can be kept at an equal level. Furthermore, the cooling rate, with regards to the flow rate, is to be optimised. The design shall be compact, simple and cost-effective.

SUMMARY OF THE INVENTION

The objective of the invention is to overcome the disadvantages of prior art. A uniform, effective and optimised cooling of electrical circuit components is to be provided. The objective is obtained by means of the present extruded aluminum electrical circuit component carrier, on which one or more electrical circuit component(s) is/are is to be mounted. The carrier comprises first and second side portions. Said first side portion comprises an area for mounting at least one first electrical circuit component part, and said second side portion comprises an area for mounting at least one second electrical circuit component part.

Further, the carrier comprises an inlet to which an inlet conduit for cooling liquid can be connected, and an outlet to which an outlet conduit for cooling liquid can be connected. One or more supply passages are formed through the first side portion of the carrier, and one or more return passages are formed through the second side portion of the carrier. The supply and return passages are connected in series, whereby the inlet of the supply passages is located on the same side of the carrier as is the outlet of the return passages.

The cooling of the electrical circuit components is made highly uniform by the provision of return passages of smaller cross-section area than the supply passages. The cooling circuit of the present carrier, comprising the supply and return passages, is arranged to, in succession, cool two or more electrical circuit component parts. The smaller cross-section area of the return passages increases the cooling rate of the return passages, wherein the cooling of the at least one second electrical circuit component part is improved. This improved cooling compensates for the higher cooling liquid temperature in the return passages. Thus, a uniform cooling of the first and second electrical circuit component parts is achieved by means of a compact electrical circuit component carrier.

The first and second side portions can be comprised of left and right, or upper and lower, portions of the carrier. The at least two electrical circuit component parts can be two or more discrete components, or be two parts of one single component.

A flat extruded aluminum component carrier in accordance with the present invention entails high strength yet simple and cost-effective design. Aluminium is a material of high thermal conductivity, which is beneficial.

The respective passages can have an arbitrary cross-section, such as circular, elliptical or polygonal. However, an increased cooling can be achieved by means of supply and/or return passages with cross-sections that are adapted to promote in-plane flow. In this regard, a polygonal cross-section is preferred. The inner corners of a polygonal passage act to lower the flow velocity of the cooling liquid in the corner areas, which promotes in-plane flow. A cross-section including a sharp inner corner, preferably an acute angle, is especially advantageous. An optimised cooling can be achieved by means of the provision of an essentially triangular cross-section of the return and/or supply passages. The optimisation of the cross-section can be applied to both the supply and the return passages, or to one of them only.

If a triangular cross section is applied, the supply and/or return passages may be arranged so that a side of the cross-section triangles faces the surface of the carrier, which results in a large heat transfer area between the electrical circuit component parts and the cooling liquid. In order to optimise the cooling rate, the cross-section triangles can have a height-to-width ratio of at least 2.

The electrical circuit component carrier may further comprise an inlet manifold, an end manifold, and an outlet manifold. The inlet and outlet manifolds are attached to a first end of the carrier, and the end manifold is attached to a second end of the carrier. Said inlet and outlet manifolds may be integrated into one piece or formed as two separate parts.

The inlet manifold connects the inlet conduit for the liquid coolant to the supply passages. Similarly, the outlet manifold connects the outlet conduit to the return passages. The end manifold connects the supply passages to the return passages. In order to equalise any temperature differences between the coolant passing through the individual supply passages, the end manifold may comprise a mixing chamber, which collects and mixes the coolant from all supply passages. After said mixing, the end manifold leads the coolant to the respective return passages.

By means of the manifolds, which are attached to the carrier, an extruded carrier can be put to use. The manifolds can be designed in accordance with prevailing circumstances, while the carrier can be advantageously mass produced.

The component carrier may further include a cooling arrangement that comprises an inlet conduit, an outlet conduit and a cooling liquid pump. The pump is connected to and arranged between the outlet conduit and the inlet conduit.

BRIEF DESCRIPTION OF THE DRAWINGS

Further features and advantages of the invention will now be described with reference to the enclosed figures, where.

Neither the figures nor the description below shall limit the scope of the present invention. Throughout the drawings, the same reference numerals have been used for the same or corresponding parts.

DETAILED DESCRIPTION

Figure 1:
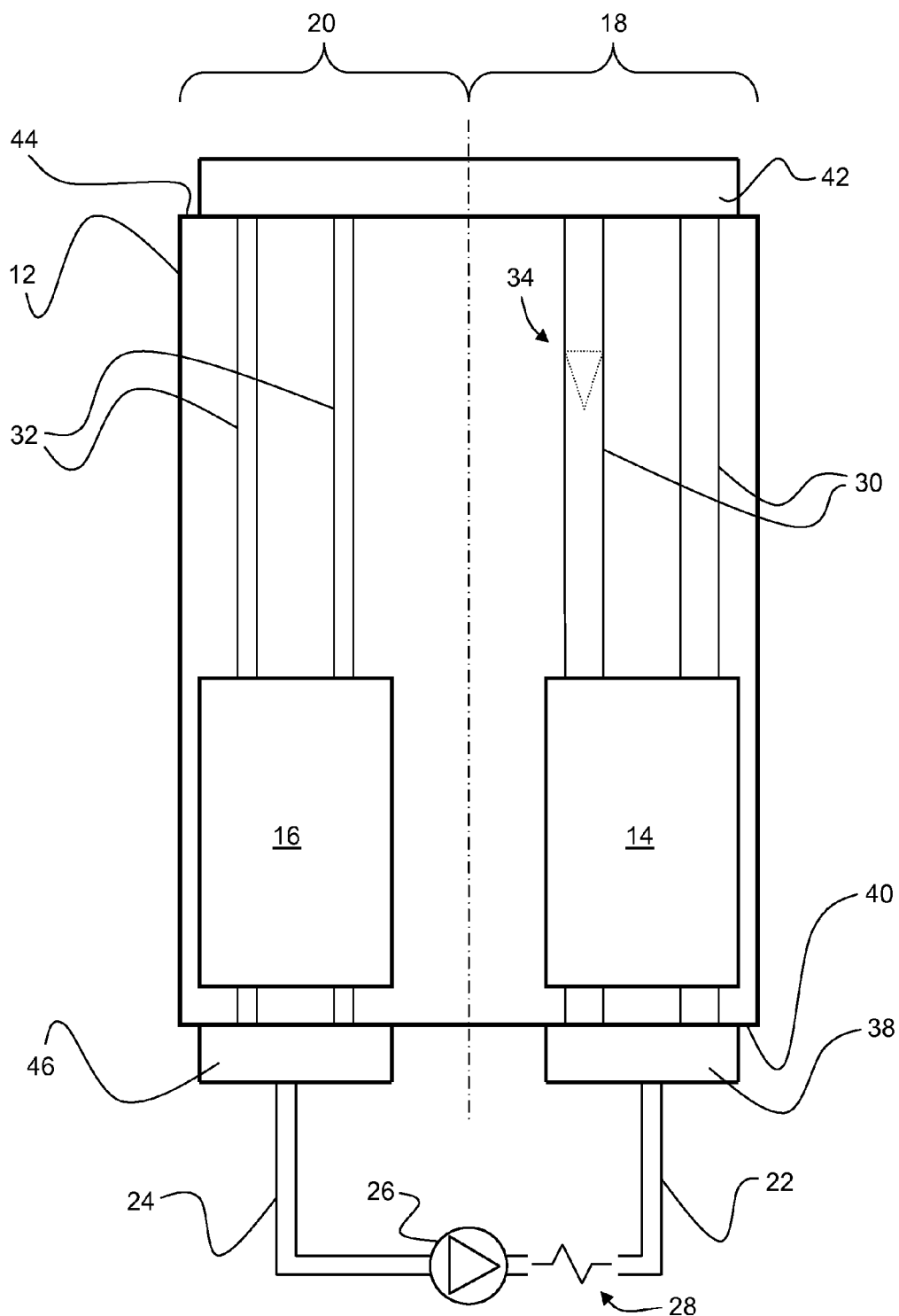
FIG. 1 shows a plan view of an example of an electrical circuit component carrier in accordance with the invention, having electrical components mounted on an upper face.
Figure 2:
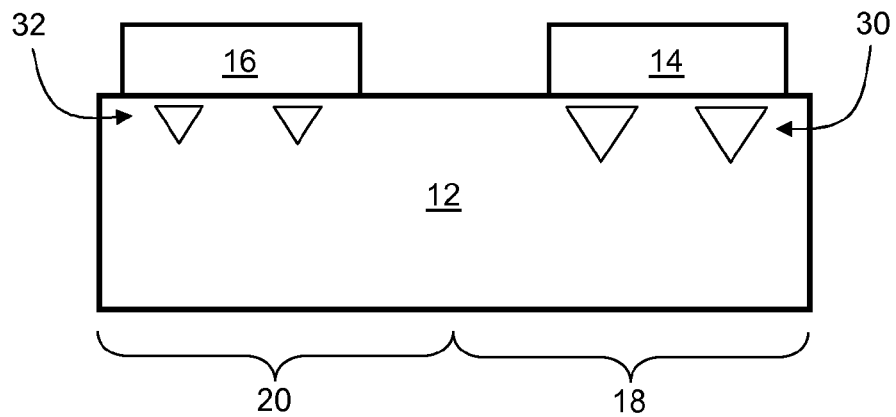
FIG. 2 illustrates a cross-section through the carrier of FIG. 1.

FIG. 1 shows an electrical circuit component carrier 12 in accordance with the invention. The carrier 12 carries a first and a second electrical circuit component 14, 16. The components 14, 16 are mounted, in an arbitrary manner which is not discussed here, on the surface of the carrier 12. The purpose of the component carrier 12 is to hold the components 14, 16, and also to cool the components 14, 16. Supply and return passages 30, 32 for a cooling liquid pass through the carrier 12 close to the surface of the carrier where the components 14, 16 are arranged, as can be seen in FIG. 2.

The electrical circuit component carrier 12 may further comprise an inlet conduit 22, an outlet conduit 24 and a pump 26. The inlet conduit 22 is connected to an inlet manifold 38, which distributes cooling liquid from the inlet conduit 22 to the supply passages 30. Correspondingly, the outlet conduit 24 is connected to the return passages 32 via an outlet manifold 46. In the present example, two supply passages 30 and two return passages 32 are used. The inlet manifold 38 and the outlet manifold 46 are arranged at the same end 40 of the carrier 12. At the opposite end 44 of the carrier 12, an end manifold 42 is arranged. The purpose of the end manifold 42 is to connect the supply passages 30 to the return passages 32. The number of passages 30, 32 can be varied depending on the prevailing circumstances. An advantage of using a plurality of supply and return passages 30, 32, respectively, is that the cooling is improved if the cooling action is spread over a larger carrier 12 area. Furthermore, the cooling is improved when the flow is distributed over a plurality of smaller passages 30, 32.

In operation, a cooling liquid is circulated from the inlet conduit 22 through the inlet manifold 38, the supply passages 30, the end manifold 42, the return passages 32, the outlet manifold 46, the outlet conduit 24 and back to the inlet conduit by the pump 26. The supply passages 30 are arranged through a first side portion 18 of the carrier 12, and the return passages 32 are arranged through a second side portion 20 of the carrier 12. In FIGS. 1 and 2, the first side portion 18 is the right half of the parallelepipedic carrier 12 and the second side portion 20 is the left half.

The supply and return passages 30, 32 are connected in series. Thus, the same flow of cooling liquid passes through the supply and return passages 30, 32. The cross-section area of the return passages 32 is smaller than the cross-section area of the supply passages 30. Thus, it is apprehended that the flow velocity is higher in the return passages 32. Tests have shown that an increased flow velocity entails better cooling performance. Thus, the narrower passages 32 leading through the second side portion 20 improves the cooling capacity of the second side portion 20. Another factor that affects the cooling capacity is the temperature difference between the cooling liquid and the components to be cooled. The temperature of the cooling liquid is higher in the return passages 32 than in the supply passages 30, due to the fact that the cooling liquid entering the return passages 32 has already been heated by the electronic circuit component 14 mounted on the first side portion 18. This higher temperature, which normally would lead to lowered cooling capacity on the second side portion 20, is balanced by the higher flow velocity through the return passages 32 arranged in the second side portion 20.

The first and second electrical circuit components 14, 16 shown in FIG. 1 could also constitute parts of one single electrical circuit component. Such a single component would then be arranged over the component areas of both the first and second side portions 18, 20 of the carrier 12. In that case, the present electrical circuit component carrier 12 acts to even out temperature differences between parts within that single electrical circuit component, rather than temperature differences between different electrical circuit components 14, 16.

As is illustrated at 34 in FIG. 1, the supply passages 30 and the return passages 32 can have a triangular cross-section. Tests have shown that a triangular cross-section entails high cooling performance. In fact, the performance rise can be up to 20%, when compared to circular passages. The reason for the increased cooling performance is that the flow velocity varies over the triangular cross-section. Basically, due to viscous forces, the flow velocity is lower in the three corners of the triangle, and higher in the triangle centre area. This gives rise to a pressure gradient, the pressure being lower where the flow velocity is higher, and an in-plane flow. By "in-plane flow" is meant a flow that is perpendicular to the flow in the longitudinal direction of a flow passage. This in-plane flow leads to increased turbulence, which improves the heat conduction from the carrier 12 material to the cooling liquid flowing in the passages 30, 32.

Besides the preferred triangular coolant passage cross-section, a number of other designs are conceivable. A polygonal cross-section involves the advantage that the flow characteristics within the passages 30, 32 are influenced so than in-plane flow is promoted, as has been described above. Especially, cross-sections comprising acute angles are advantageous. Further, a cross-section should preferably comprise a straight side that can be arranged towards the components to be cooled.

In examples of the invention that are described here, both the supply passages 30 and the return passages 32 have cross-sections that promote in-plane flow. However, it is also conceivable that only the supply passages 30, or alternatively, only the return passages 32, have cross-sections that promote in-plane flow. The other passages 30, 32 would then have a circular cross-section. In this way, the cooling rate can be locally increased in the first or the second side portion 18, 20 only.

The electrical circuit component carrier 12 may further comprise a heat exchanger 28, arranged externally of the carrier 12. The heat exchanger 28 can be used to lower the temperature of the cooling liquid after the cooling liquid has passed through the carrier 12. The heat exchanger 28 may be arranged upstream or downstream of the pump 26, and may use the surrounding air to cool the cooling liquid. Instead of a heat exchanger, the cooling arrangement may comprise a cooling reservoir 28 in which the heated cooling liquid that exits the carrier 12 is mixed with a large volume of cooling liquid of a lower temperature before the cooling liquid is recirculated into the carrier 12. The thermal energy that is supplied to the cooling reservoir 28 may be led from the surface of the reservoir to the surrounding by means of radiation, conduction and/or convection.

By providing a mixing chamber (not shown) within the end manifold 42 and connecting the respective supply passages 30 to said chamber, the temperature of the cooling liquid from the respective supply passages 30 is evened out before the cooling liquid enters the return passages 32. This entails that the temperature of the cooling liquid entering the return passages 32 is the same for each one of the return passages 32, which ensures uniform cooling.

Figure 3:
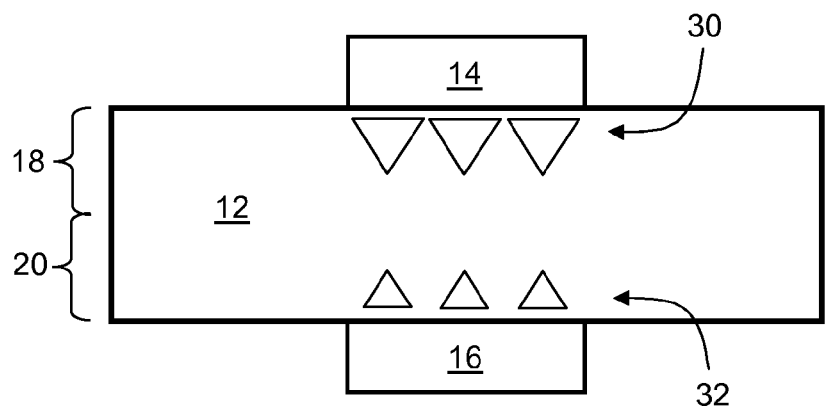
FIG. 3 shows a cross-section through a carrier in accordance with the invention, having components mounted on an upper and a lower face.
Figure 4:
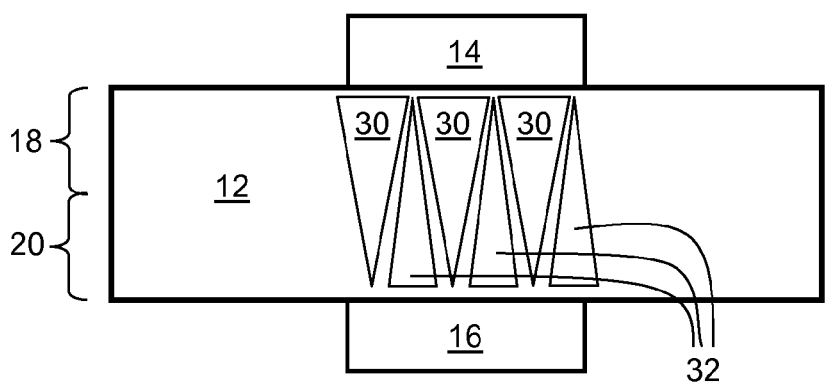
FIG. 4 illustrates the cross-section with another type of supply and return passages.

In the examples of FIGS. 3 and 4, the first side portion (18) is an upper half of a parallelepipedic carrier 12. The second side portion (20) is the lower half. The first electronic circuit component 14 is mounted on the upper side surface of the carrier 12, and the second electronic circuit component 16 is mounted on the lower side surface. FIGS. 3 and 4 illustrate an example of the carrier 12 where three supply passages 30 and three return passages 32 are put to use. As can be seen, the passages 30, 32 cover essentially the whole surface of the electronic circuit components 14, 16, which is beneficial for the cooling of the components 14, 16.

In FIGS. 1 and 2, the apices of the cross-section triangles of the supply and return passages 30, 32 point in the same direction. In FIGS. 3 and 4, the apices of the cross-section triangles of the supply and return passages 30, 32 point towards each other.

When the electronic circuit components 14, 16 are mounted on the upper and lower side of the carrier 12, the supply and return passages 30, 32 are arranged close to the upper and lower surfaces of the carrier 12, respectively, see FIG. 3. As has been described with reference to FIGS. 1 and 2, the cooling liquid is first led through the supply passages 30 in order to cool first electronic circuit component 14, and then through the return passages 32 in order to cool second electronic circuit component 16.

FIG. 4 shows an example in accordance with FIG. 3, but in FIG. 4 the passages 30, 32 have a height that essentially exceeds the width. Tests have shown that triangular cooling passages with a height that essentially exceeds the width provide a highly efficient cooling capacity. Put in other words, a triangular cross-section with a large extension in one direction and a small extension in another direction is desired.

Generally, the heat transfer between a solid and a fluid is proportional to the heat transfer coefficient, h.

The Dittus-Boelter equation expresses the heat transfer coefficient as $$h = \frac{k}{D_h} Nu$$

where k is the thermal conductivity of the fluid, $D_h$ is the hydraulic diameter and Nu is Nusselts number. From this equation, it is apprehended that the heat transfer coefficient increases with a decreased hydraulic diameter.

Now, the hydraulic diameter $D_h$ is determined by the equation $$D_h = \frac{4 \cdot A}{p}$$

where A is the cross-section area of the passage and p is the wetted perimeter. If the cross-section area is kept constant, the hydraulic diameter decreases as the wetted perimeter, i.e. the circumference of the cross-section triangle, increases.

In accordance with the present invention it has been found that triangular passages with a large extension in one direction and a small extension in another direction are excellent for cooling electrical circuit components mounted on an aluminium surface.

Figure 5:
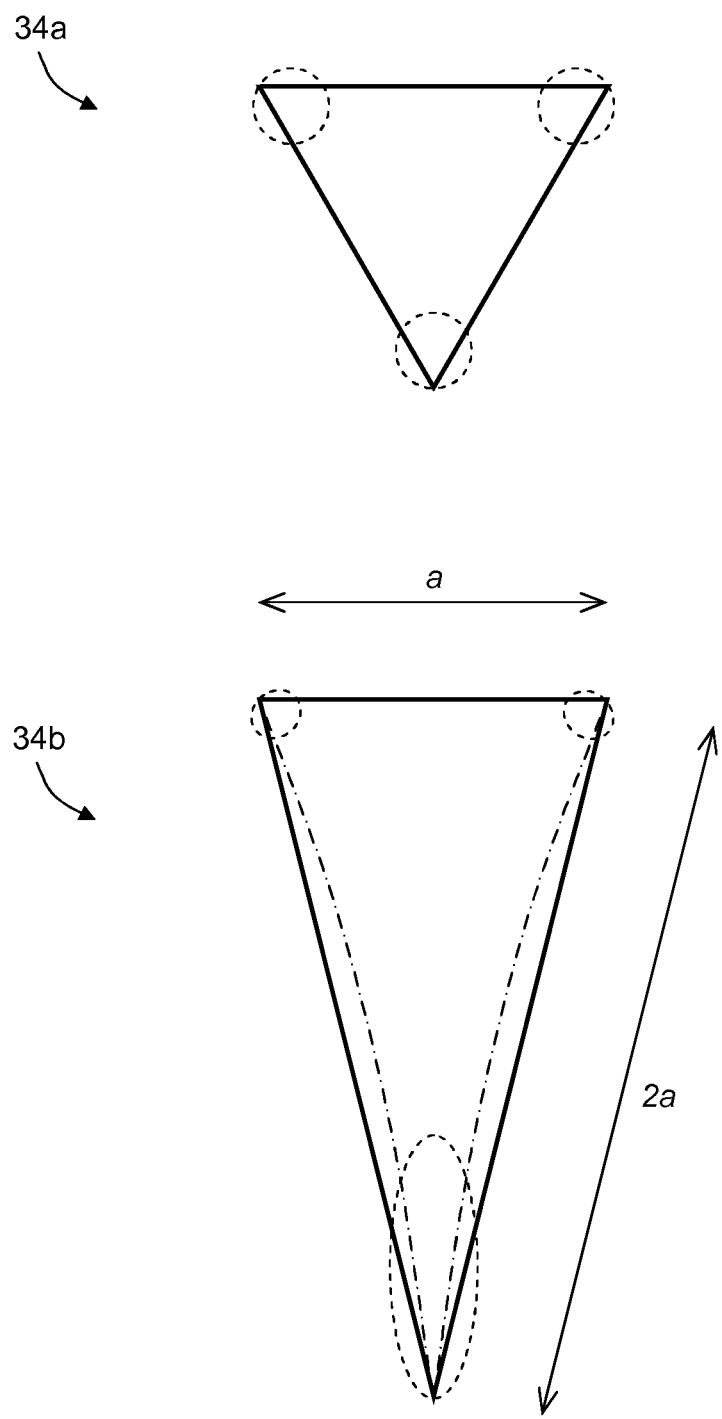
FIG. 5 is an enlargement of two different passage cross-sections.

FIG. 5 illustrates two different cooling passage cross-sections 34a, 34b. The first cross-section 34a is an equilateral triangle, which is also shown in exemplifying FIGS. 2 and 3. In the three triangle corners, low flow velocity areas are encircled by dashed lines. Since all three angles are equal, the flow velocity drop is the same in all corners. In accordance with Bernoulli's principle, the lower flow velocity results in higher pressure in the encircled areas. An in-plane flow will act to equalise the pressure differences within the cross-section, improving the heat transfer coefficient. Basically, said in-plane flow will run from the corners of the equilateral triangle 34a towards the centre of the triangle 34a.

The second cross-section 34b of FIG. 5 is a triangle with a large height-to-width ratio, resembling the cross-section indicated at 34 in FIG. 1. The shown triangle 34b is an isosceles triangle and the base length a is approximately half the isosceles length 2a. Again, the corner areas, where the flow velocity is lower, are encircled. As can bee seen, the two blunter angles have been encircled by relatively small ellipses, whereas the sharper angle has been encircled by a larger ellipse. The size of the ellipses indicates the magnitude of the locally decreased flow velocity, and the accordingly increased pressure. The sharper angle gives rise to a considerable in-plane flow towards the base of the triangle, upwards in the figure. This in-plane flow is much larger than those emanating from the blunter corners of the first and second cross-section 34a, 34b of FIG. 5. The upwards in-plane flow of the second cross-section 34a is advantageous as it is directed towards the base of the triangle 34a, which is where the electronic circuit component 14, 16 is located.

Throughout the FIGS. 2 to 3, is can be seen that the triangular cooling passages are always arranged so that a side of the cross-section triangle faces the surface of the carrier 12, and thereby the electrical components 14, 16 to bee cooled. When a cross-section of large height-to-width ratio is used, the base of the cross-section triangle should face the surface of the carrier 12. The fact that the flow velocity has a maximum close to the triangle base improves the cooling performance.

Although an isosceles triangle has been chosen for the cooling passage cross-sections of FIGS. 1, 4 and 5 (second cross-section 34b), other triangle forms can be used when optimising the heat transfer coefficient. E.g., a right-angled cross-section could be put to use. One advantage of the isosceles triangle cross-section is that the geometrical symmetry could contribute to a maximised in-plane flow towards the base of the cross-section. Independently of which triangle form is chosen, an important aspect, if the heat transfer coefficient is to be optimised, is that the height-to-width ratio is at least in the order of 2.

In any polygonal cross-section, an inner angle can be sharpened by the use of inwardly curved side walls. Thus, inwardly curved side walls can be used to enhance the in-plane flow. An especially advantageous cross-section could be a triangle with two inwardly curved sides, and one straight side (indicated by dash dotted lines in FIG. 5). Thereby, a high heat transfer coefficient is obtained, while the straight side of the triangle can face the component to ensure good heat transfer from the components to the cooling liquid of the passage.

In theory, a larger height-to-width ratio leads to a lower hydraulic diameter and thus to a higher heat transfer coefficient. Thus, a coolant passage cross-section in the form of a crevice or a slot, presenting a very large height-to-width ratio, should be preferred. The benefits of such a cross-section are however counteracted by increased flow resistance, requiring unreasonable high pump power. The triangle base, which faces the electronic component, must be of a substantial width in order to provide cooling. Alternatively, a plurality of triangular passages can be arranged side by side, which however also leads to increased flow resistance. Tests have shown that an appropriate heat transfer coefficient, and thus an efficient cooling performance, is obtained when the triangle base length is less than half the side length. This corresponds to a height-to-width ratio of approximately 2.

The cooling passage geometries of FIGS. 2 and 3 are not optimised, but correspond to the first triangle 34a of FIG. 5. More optimised passage cross-sections are shown in FIG. 4, where the triangle base length is less than half the isosceles length. It is to be appreciated that such cross-sections also can be used for the passages 30, 32 of FIG. 2. By arranging the respective supply passages 30 alternating with the respective return passages 32, as is shown in FIG. 4, an efficient yet compact electrical circuit component carrier 12 is obtained. The passages 30, 32 of FIG. 4 extend throughout essentially the whole thickness of the carrier 12.

Although not shown, the electrical circuit component carrier 12 may carry more than one electrical circuit component 14, 16 on the respective side portions 18, 20. The smaller cross-section of the return passages 32, when compared to the supply passages 30, provide for efficient cooling of the components on the second side portion 20, even though the cooling liquid temperature is higher in return passages that are arranged in the second side portion 20.

All the respective supply passages 30 are of the same cross-sectional area, this applies also to the return passages 32. The reduced cooling passage area of the return passages 32, when compared to the supply passages 30, can be adjusted so that the temperatures of the electrical circuit components 14, 16 on the respective side portions 18, 20 are equalised. If more than one electrical circuit component 16 is arranged on the second side portion 20, the return passage area is advantageously reduced by such a factor that the temperature of the most upstream component of the second side portion 20 is limited to the same working temperature as the most upstream electrical circuit component 16 of the first side portion 18. In a typical electrical circuit component carrier, carrying two or more components 14, 16, such a reduction factor amounts to 15-25% and preferably 18-22%. These reduction factors are suitable for evening out a temperature difference of 10° C. between the most upstream component of the second side portion 20 and the most upstream electrical circuit component 16 of the first side portion 18. Should these suggested reduction factors not suffice for evening out said temperature difference, the reduction factor can be increased.

Another advantage of the reduced cooling passage area of the return passages 32 is that a lower coolant flow rate suffices for keeping the electrical circuit components 14, 16 under a prescribed temperature. If no measures were taken to obtain a uniform cooling, the temperature of the most down-stream component 16 cooled by the return passages 32 would determine the required coolant flow rate. This would lead to the components 14 mounted upstream of said component being cooled more than needed. By means of the present uniform cooling, a lower coolant flow rate can be used.

The different designs of FIGS. 2, 3 and 4 require different inlet, end and outlet manifolds 38, 42, 46. The inlet and outlet manifolds 38, 46 can be two separate units, as shown in FIG. 1, or be integrated in one unit (not shown). It is also possible to integrate all manifolds 38, 42, 46 into the carrier 12. If the manifolds 38, 42, 46 are provided as separate units which are attached to the carrier 12, an extruded carrier 12, requiring no or a minimum of post-processing, can be used. One suitable joining technique for attaching the manifolds 38, 42, 46 to the carrier 12 is friction stir welding, this technique being cost-effective and fast. A suitable material for the manifolds, as well as for the carrier, is aluminium.

The electrical circuit components that are mounted on the present electrical circuit component carrier typically operate within a temperature range of 60-120° C. The cooling liquid could consist of water and glycol, and have an operating temperature of 50-90° C., where the cooling liquid enters the carrier at a temperature of 50° C. and exits the carrier at a temperature of 90° C. For higher operation temperatures, oil can be used instead of water and glycol.

One example of an efficient electrical circuit component carrier comprises a carrier having a width of 100 mm, a length of 100 mm and a thickness of 10 mm. Four electrical circuit components are mounted on the carrier. Two components are arranged on the first side portion, and two components are arranged on the second side portion. This example corresponds to the illustration of FIG. 1, but with four components instead of two. Further, five supply and return passages are used. All four components generate a respective 500 W heat load. The supply passages 30 have a width of 1.0 mm and a height of 2.0 mm and the return passages 32 have a width of 0.8 mm and a height of 2.0 mm. Thus, the cross section reduction of the flow passages 30, 32 is 20%.

It is to be apprehended that the electrical circuit component carrier operatively can be mounted e.g. up side down. Throughout this text, the terms "upper/lower" as well as "left/right" are used when referring to the electrical circuit component carrier as it is oriented in the enclosed figures.

The invention claimed is:

1. An extruded aluminum electrical circuit component carrier on which at least one electrical circuit component is to be mounted, said carrier comprising:

a first side portion and a second side portion, wherein said first side portion comprises an area for mounting at least one first electrical circuit component part and said second side portion comprises an area for mounting at least one second electrical circuit component part, an inlet to which an inlet conduit for a cooling liquid can be connected, an outlet to which an outlet conduit for the cooling liquid can be connected, and at least one supply passage for the cooling liquid, wherein the at least one supply passage is formed through the first side portion of the carrier, and at least one return passage for the cooling liquid, wherein the at least one return passage is formed through the second side portion of the carrier, wherein the at least one supply passage is connected to the at least one return passage in series, wherein an area of a cross-section of the at least one return passage is smaller than an area of a cross-section of the at least one supply passage, whereby in use a flow velocity of the at least one return passage exceeds a flow velocity of the at least one supply passage so that an essentially uniform cooling capacity for the first and second electrical circuit component parts is achieved.

2. The carrier according to claim 1, wherein the first side portion and the second side portion constitute right and left side portions of the carrier, so that the first and second electrical circuit component parts are arranged side by side on the carrier.

3. The carrier according to claim 1, wherein the first side portion and the second side portion constitute upper and lower portions of the carrier, so that the first and second electrical circuit component parts are arranged on opposite sides of the carrier.

4. The carrier according to claim 1, wherein the area of the at least one return passage is adjusted in relation to the area of the at least one supply passages, so that a working temperature of a most upstream electrical circuit component part of the first side portion essentially equals a working temperature of a most upstream electrical circuit component part of the second side portion.

5. The carrier according to claim 4, wherein the area of the at least one return passage is about 15-25% smaller than the area of the at least one supply passage.

6. The carrier according to claim 4, wherein the at least one supply passage has a width of approximately 1 mm and a height of approximately 2 mm, and the at least one return passage has a width of approximately 0.8 mm and a height of approximately 2 mm.

7. The carrier according to claim 1, wherein the at least one supply and/or at least one return passage has a cross-section that is adapted to promote in-plane flow.

8. The carrier according to claim 7, wherein the at least one supply and/or at least one return passage has a triangular cross-section and are arranged so that a side of the cross-section triangles faces a surface of the carrier, which results in a large heat transfer area between the at least one electrical circuit component part and the cooling liquid.

9. The carrier according to claim 1, wherein the at least one supply and/or at least one return passage has a triangular cross-section with a height-to-width ratio of at least 2.

10. The carrier according to claim 1, wherein the at least one supply and at least one return passage have a triangular cross-section in a form of an isosceles triangle, and a base of the isosceles triangle faces a carrier surface.

11. The carrier according to claim 1, further comprising: a plurality of supply passages and a plurality of return passages.

12. The carrier according to claim 1, further comprising: a cooling arrangement comprising
an inlet conduit,
an outlet conduit, and
a cooling liquid pump connected to and arranged between the outlet conduit and the inlet conduit.

13. The carrier according to claim 1, further comprising:
an inlet manifold which is attached to a first end of the carrier and connects the at least one supply passage to the inlet conduit,
an end manifold which is attached to a second end of the carrier and connects the at least one supply passage to the at least one return passage, and
an outlet manifold which is attached to the first end of the carrier and connects the at least one return passage to the outlet for the outlet conduit.

14. The carrier according to claim 12, wherein the end manifold comprises a mixing chamber to which the at least one supply passage and the at least one return passage are connected.

15. A method for cooling at least one electrical component, the method comprising:
providing an extruded aluminum electrical circuit component carrier comprising
a first side portion and a second side portion, wherein said first side portion comprises an area for mounting at least one first electrical circuit component part and said second side portion comprises an area for mounting at least one second electrical circuit component part,
an inlet to which an inlet conduit for a cooling liquid can be connected and an outlet to which an outlet conduit for the cooling liquid can be connected,
at least one supply passage for the cooling liquid, wherein the at least one supply passage is formed through the first side portion of the carrier, and
at least one return passage for the cooling liquid, wherein the at least one return passage is formed through the second side portion of the carrier, wherein the at least one supply passage is connected to the at least one return passage in series,
wherein an area of a cross-section of the at least one return passage is smaller than an area of a cross-section of the at least one supply passage, whereby in use a flow velocity of the at least one return passage exceeds a flow velocity of the at least one supply passage so that an essentially uniform cooling capacity for the first and second electrical circuit component parts is achieved;
mounting at least one electrical circuit component on at least one of the first side portion and the second side portion of the carrier;
connecting an inlet conduit to the inlet and an outlet conduit to the outlet; and
directing coolant through the inlet conduit.

16. The carrier according to claim 4, wherein the area of the at least one return passage is about 18-22% smaller than the area of the at least one supply passage.

17. The carrier according to claim 1, wherein the at least one supply and/or at least one return passage has a polygonal cross-section.

18. A method for manufacturing an extruded aluminum electrical circuit component carrier on which at least one electrical circuit component is to be mounted, the method comprising:
forming a first side portion and a second side portion, wherein said first side portion comprises an area for mounting at least one first electrical circuit component part and said second side portion comprises an area for mounting at least one second electrical circuit component part,
forming an inlet to which an inlet conduit for a cooling liquid can be connected, an outlet to which an outlet conduit for the cooling liquid can be connected, and forming at least one supply passage for the cooling liquid through the first side portion of the carrier, and forming at least one return passage for the cooling liquid through the second side portion of the carrier such that the at least one supply passage is connected to the at least one return passage in series, wherein an area of a cross-section of the at least one return passage is smaller than an area of a cross-section of the at least one supply passage, whereby in use a flow velocity of the at least one return passage exceeds a flow velocity of the at least one supply passage so that an essentially uniform cooling capacity for the first and second electrical circuit component parts is achieved.

\* \* \* \* \*